's006898419B1

United States Patent
Fayeski et al.

(10) Patent No.: US 6,898,419 B1
(45) Date of Patent: May 24, 2005

(54) REMOTELY ADJUSTABLE BANDPASS FILTER

(75) Inventors: Eric S. Fayeski, Calgary (CA); Brad W. Carlson, Calgary (CA)

(73) Assignee: Nortel Networks Corporation, Montreal (CA)

( * ) Notice: Subject to any disclaimer, the term of this patent is extended or adjusted under 35 U.S.C. 154(b) by 563 days.

(21) Appl. No.: 09/845,620

(22) Filed: Apr. 30, 2001

(51) Int. Cl.[7] .............................................. H04B 01/04
(52) U.S. Cl. ..................... 455/125; 455/120; 455/213; 455/286; 455/306; 455/307; 455/339; 455/561
(58) Field of Search ................................ 455/213, 286, 455/306, 307, 339, 561, 120–121, 124–125, 129; 343/722, 749–750

(56) References Cited

U.S. PATENT DOCUMENTS

| | | | |
|---|---|---|---|
| 3,697,898 A | * 10/1972 | Blachier et al. | 333/21 A |
| 3,955,198 A | * 5/1976 | Delzer | 342/165 |
| 4,157,515 A | * 6/1979 | de Bayser et al. | 333/17.1 |
| 4,186,359 A | * 1/1980 | Kaegebein | 333/134 |
| 4,339,829 A | * 7/1982 | Dimon | 455/340 |
| 4,567,401 A | * 1/1986 | Barnett et al. | 315/5 |
| 4,726,071 A | * 2/1988 | Jachowski | 455/125 |
| 5,012,211 A | 4/1991 | Young et al. | 333/212 |
| 5,200,721 A | * 4/1993 | Mansour | 333/202 |
| 5,349,316 A | 9/1994 | Sterns | 333/208 |
| 5,396,539 A | * 3/1995 | Slekys et al. | 455/426.1 |
| RE34,898 E | * 4/1995 | Turunen et al. | 333/206 |
| 5,418,818 A | * 5/1995 | Marchetto et al. | 375/264 |
| 5,446,729 A | * 8/1995 | Jachowski | 370/339 |
| 5,796,319 A | * 8/1998 | Kich | 333/206 |
| 5,926,752 A | * 7/1999 | Lin | 455/323 |
| 6,005,452 A | * 12/1999 | Ahlberg | 333/24 R |
| 6,160,460 A | * 12/2000 | Hicks et al. | 333/17.1 |
| 6,347,222 B1 | * 2/2002 | Niemela | 455/339 |
| 6,359,533 B1 | * 3/2002 | Merlock et al. | 333/203 |
| 6,362,708 B1 | * 3/2002 | Woods | 333/234 |
| 6,452,940 B1 | * 9/2002 | Yared et al. | 370/465 |
| 6,463,054 B1 | * 10/2002 | Mazur et al. | 370/352 |
| 6,529,104 B1 | * 3/2003 | Small et al. | 333/208 |
| 6,643,503 B1 | * 11/2003 | Phillips | 455/340 |
| 6,647,000 B1 | * 11/2003 | Persson et al. | 370/330 |

* cited by examiner

*Primary Examiner*—William Trost
*Assistant Examiner*—James D Ewart
(74) *Attorney, Agent, or Firm*—Schwegman, Lundberg, Woessner & Kluth, P.A.

(57) ABSTRACT

Remotely controllable actuators are provided to alter the cavity size of bandpass cavity filters to alter the bandpass characteristics. In one embodiment, a stepper motor is used to provide lateral movement of a tuning plate to alter the size of the cavity. The neck of the cavity is also changed in length through the use of a tuning motor. A feedback loop is used to provide fine tuning of the length of the neck in response to changes due to temperature and vibration to offer maximum propagation of the signal to be transmitted. A coupling tuner is used to adjust to the resulting change in Q to the cavity. A tuning processor is used to receive signals from a remote location identifying the desired characteristics of the filter.

20 Claims, 4 Drawing Sheets

REMOTELY ADJUSTABLE BANDPASS FILTER

FIELD OF THE INVENTION

The present invention relates to a remotely operable bandpass filter and, more particularly, to a bandpass filter that is remotely adjustable to selectively pass microwave signals from one of several transceivers of a cellular telephone base station pursuant to cellular telephone traffic loads or customer demand in its cell.

BACKGROUND OF THE INVENTION

Cellular or radio telephony systems utilize numerous microwave devices, such as waveguides, bandpass filters, couplers, combiners or diplexers, attenuators and resonators. Such a device exhibits selected responses to specific input signals, and these responses may be realized either by selecting and using a device having the desired response or by changing the characteristics of a single device until the desired response is achieved. Changing the characteristics of a resonant RF cavity, such as a bandpass filter, involves altering the electrical and/or magnetic characteristics thereof. For example, both bandpass Q and insertion loss depend to some extent on the electrical length L of a resonant cavity, and bandpass Q depends on the characteristics of dielectric substances (usually air) present in the cavity. Changing the characteristics of the cavity, therefore, may include altering L of the cavity by selective movement of an electrically conductive plate therein or selectively inserting into, or removing from, the cavity a non-air dielectric member.

There are several cellular telephone protocols or standards, and these include, on the one hand, Advanced Mobile Phone Service ("AMPS") and Time Division Multiple Access ("TDMA"), and, on the other hand, Enhanced Data Rate for GSM Evolution ("EDGE"). The former protocols utilize a 30 kHz bandwidth, while the latter utilizes a 200 kHz bandwidth. It may be desirable to include as subscribers to cellular telephone service in a single system of interest both subscribers using one protocol, such as AMPS/TDMA, and those using another protocol, like EDGE, in one or more or all of the cells of the subject cellular telephone system. In this event, the subject system must be capable of simultaneously operating according to the plural protocols, AMPS/TDMA or EDGE. As new subscribers using one or the other protocol join the subject system, and as present subscribers roam from cell to cell and to the subject system from other systems the ratio of subscribers using one protocol to those using other protocols change, causing the cells to change and fluctuate with time.

Changes and fluctuations may require that the ratio of AMPS/TDMA capacity to EDGE capacity (or vice versa) of the transceivers in the cells of the system be periodically adjusted. The foregoing presents a problem, inasmuch as the base stations of cellular telephone systems are usually large in number and are often remotely located from the business or service offices of the system's service provider. Moreover, these base stations are usually unmanned.

From the foregoing, as set forth more fully below, there is a need to imbue multi-protocol cellular telephone systems with the ability to adjust the capacities of base station transceivers to simultaneously handle varying demands for communication services based on the variant protocols.

SUMMARY OF THE INVENTION

Remote tuning of a plurality of bandpass cavity filters is provided to accommodate transmission of different frequencies required by different communication protocols. Remotely controllable actuators are provided to alter the cavity size of the filters or other characteristics to alter the bandpass characteristics. In one embodiment, a stepper motor is used to provide lateral movement of a tuning plate to alter the size of the cavity. The neck of the cavity is also changed in length in another embodiment through the, use of a tuning motor. A feedback loop is used to provide fine tuning of the length of the neck in response to changes due to temperature and vibration to offer maximum propagation of the signal to be transmitted.

In a further embodiment, a coupling tuner is used to adjust to the resulting change in Q to the cavity. A tuning processor is used to receive signals from a remote location identifying the desired characteristics of the filter. The signals may be provided via the communication signal, such as TDMA or EDGE signals, or may be separately transmitted and received. The tuning processor then controls the actuators to alter the filters to the desired frequencies. Multiple frequencies may be easily accommodated as desired.

DETAILED DESCRIPTION

Figure 1:
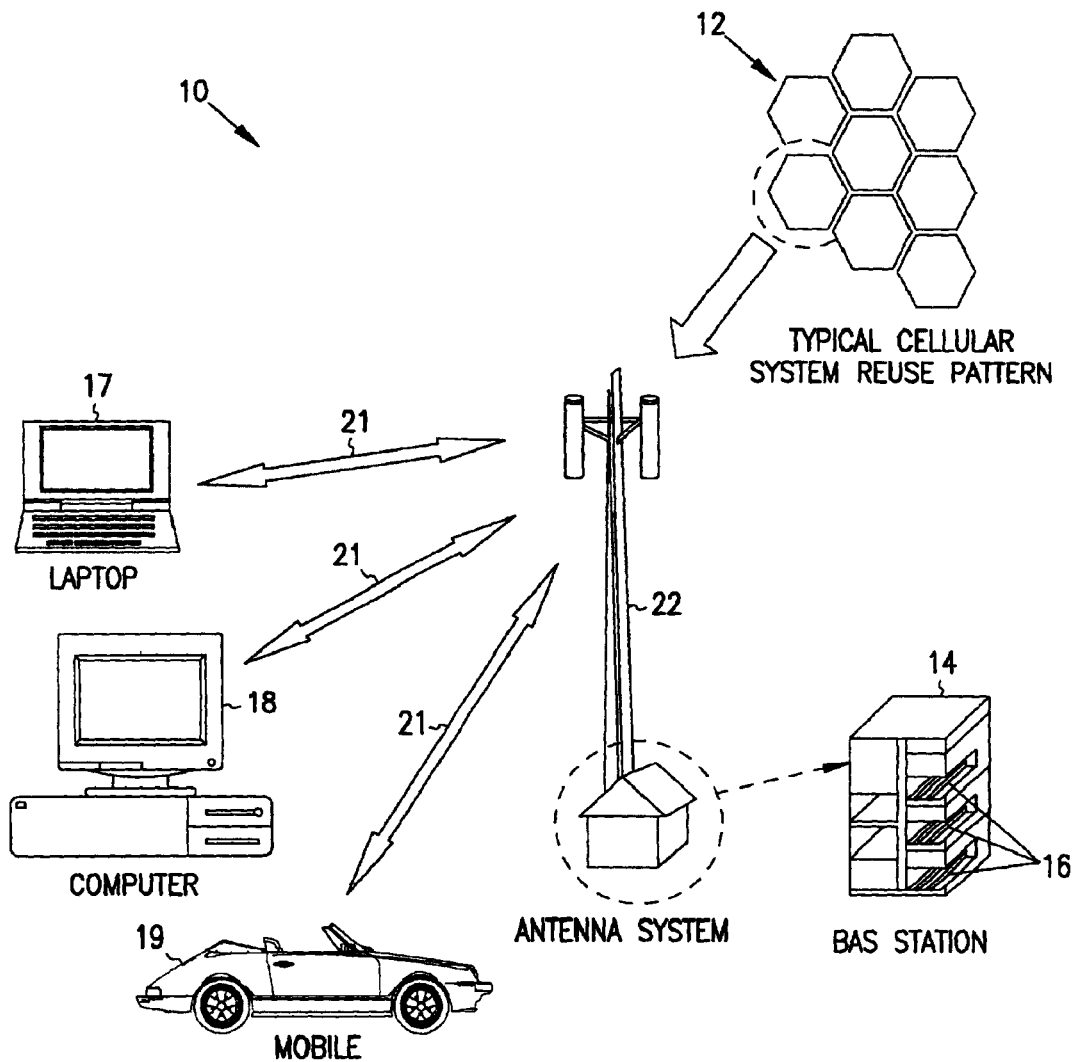
FIG. 1 is a generalized schematic depiction of a cellular telephone system utilizing the principles of the present invention.
Figure 2:
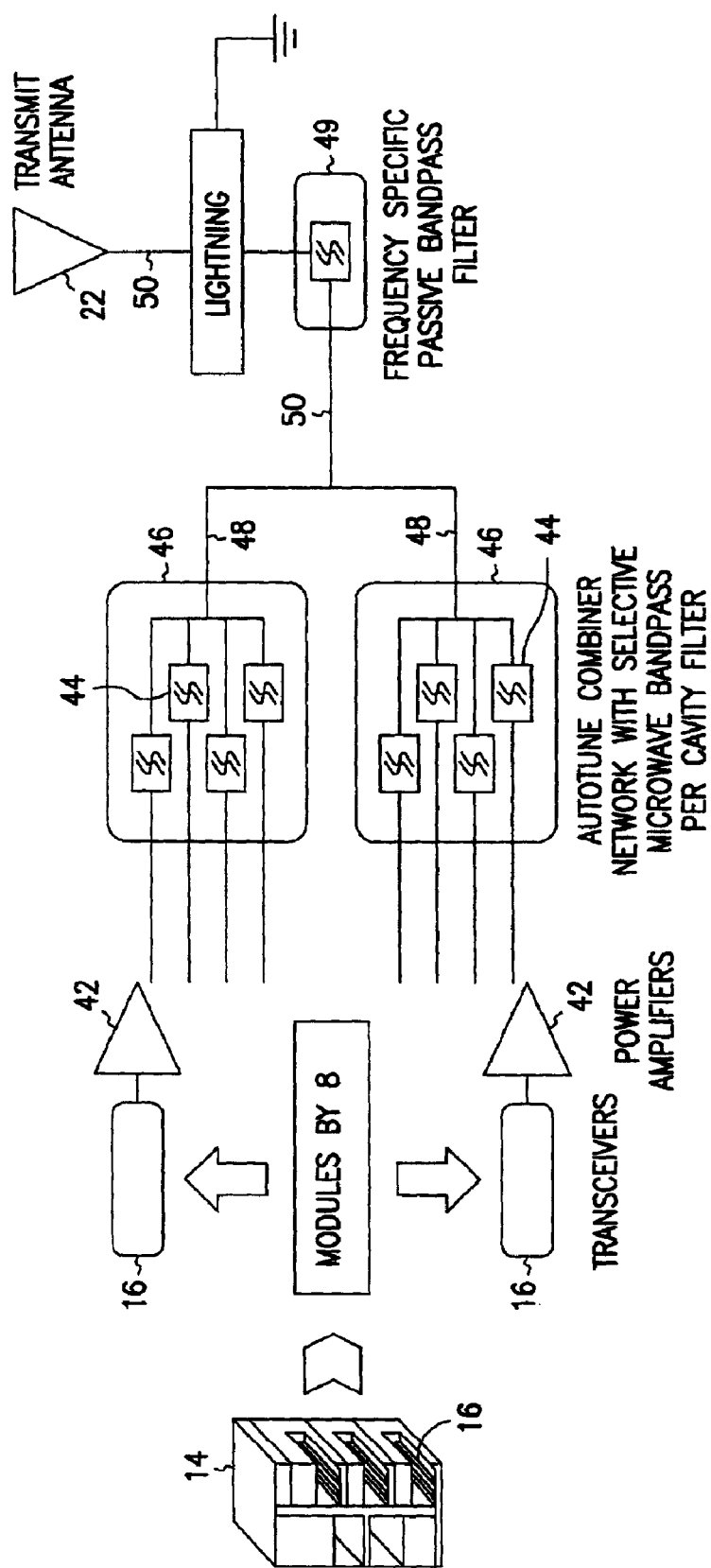
FIG. 2 is a generalized representation of a transceiver and a microwave bandpass filter assembly located in a base station of the system of FIG.

In FIGS. 1 and 2, generalized depictions of a cellular telephone system 10 are shown that utilize the principles of the present invention. The system 10 includes numerous cells 12 each of which is serviced by one or more base stations 14. There are numerous ways in which the cells 12, which are usually considered to be circular or hexagonal in shape, may be defined and located relative to each other. Typically, each base station 14 is located at the center of its cell 12 and contains multiple transceivers 16 capable of transmitting signals to and receiving signals from subscribers' telephones, personal computers and laptop computers ("units") 17, 18 and 19 that are located within, and more or less randomly scattered about, the cells 12. These communications between the transceivers 16 and the units 17–19 are carried out via self-contained unit antennae (not shown) and antennae 22 associated with the transceivers 16 in the base station 14 of each cell 12 and co-located therewith.

The units 17–19 may be stationary wireless units such as a stationary wireless telephone (not shown), a desk top personal computer 18 or stationary laptop computer 17, or may be mobile, such as an automobile phone or wireless telephone 19 or moving laptop computer 17. The latter units 17 and 19, of course, have the capability of wandering in and out of their "home" cell 12 and into and out of other "visited" cells 12 of the system 10. A mobile unit 17 and 19 can also wander into and out of its "home" system 10 and into another "visited" system similar to system 10. This wandering is termed "roaming." Various communication and billing methodologies related to the effectuation and implementation of roaming are known.

Each system 10 may also include various switching facilities that effect the connection of the system 10 to foreign systems, such as the wire-connected or Public Switched Telephone Network ("PSTN"), other cellular systems, and satellite transceiving stations. In further embodiments, adjuncts to system 10 include a home office or headquarters, service centers, and/or buildings housing the switching facilities. These adjuncts, while populated with employees and contractors of the owner/operator of system 10, are remote from most of the base stations 14.

Typically, units 17–19 and the transceivers 16 of the system 10, have utilized a single communication protocol, such as AMPS/TDMA (30 kHz) or EDGE (200 kHz). There is increasing momentum to enable cellular systems 10 to simultaneously utilize two or more protocols. Implementing the foregoing presents problems arising from the fact that most of the base stations 14 are usually unmanned and are usually remote from the majority of the system's manned sites, such as its general offices, service centers, and switching centers. Specifically, although manual techniques are known for simultaneously utilizing microwave signals having different bandwidths and center frequencies, manual techniques utilized on the site of a base station 14 would prove unsatisfactory, as they would require the presence of personnel at the preferably unattended base stations 14.

Figure 3:
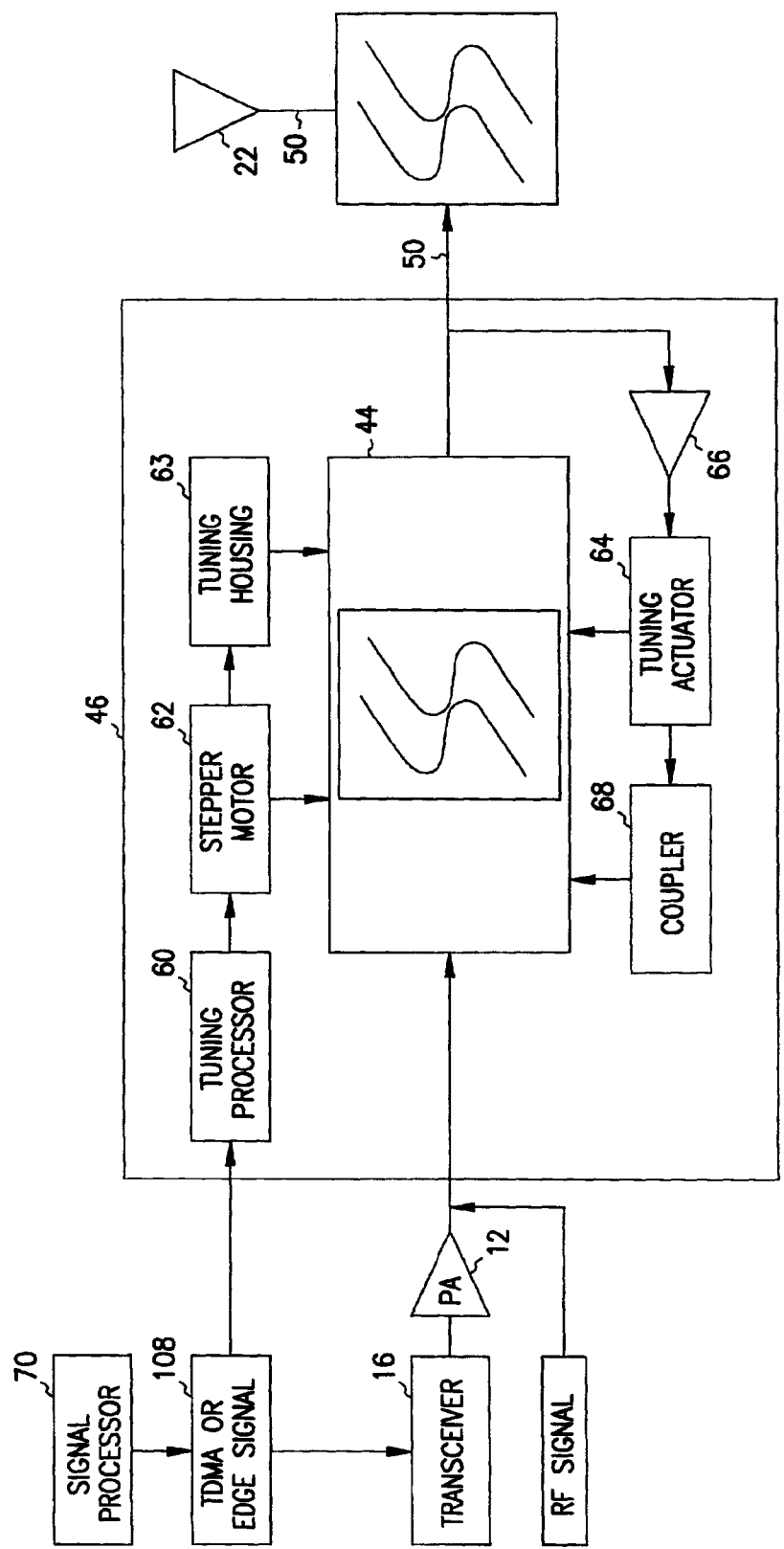
FIG. 3 is a more specific, schematic representation of the microwave bandpass filter of FIG. 2.
Figure 4:
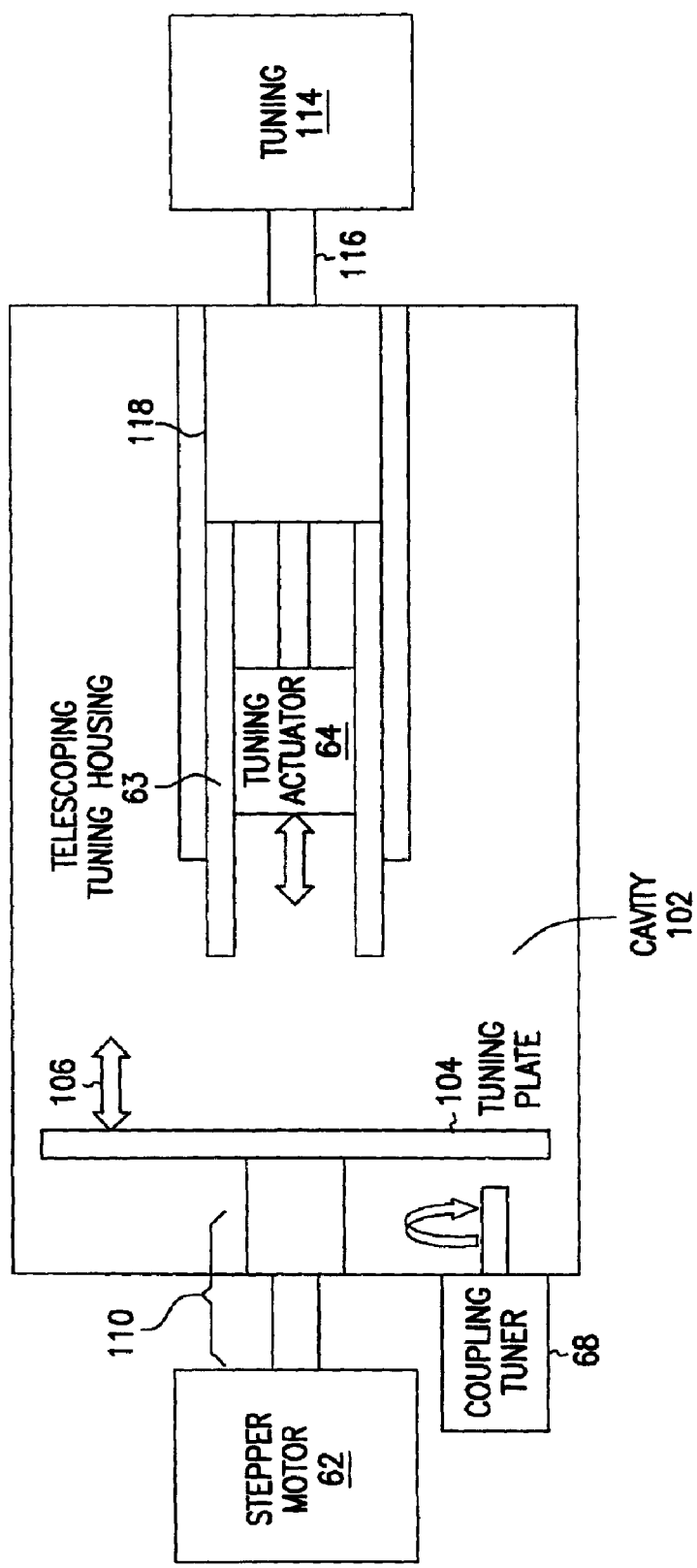
FIG. 4 is a mechanical block diagram of the microwave bandpass filter and details the construction and operation of components to actuate the principles of the invention.

One technique for permitting one or more transceivers 16 at a base station 14 to simultaneously utilize AMPS/TDMA and EDGE is generally illustrated in FIG. 2. Resonant cavity coupling loop adjustment, and its effect on bandpass cavity characteristics, are controlled via remote activation. Base station 14 comprises eight transceiver modules in one embodiment which are coupled to corresponding RF power amplifiers 42. Each power amplifier is coupled to an autotune combiner network 46 having selective microwave bandpass per cavity filter 44. Further detail of a combiner network is shown in FIGS. 3 and 4. The combiner network 46 is coupled to a further frequency specific passive bandpass filter 49, which in turn is coupled to transmit antenna 22. Lightning protection is coupled to both sides of the bandpass filter 49 as indicated at 50.

The cavities in the combiner network 46 work independently of each other, but are combined though a phasing network to provide a single output point for transmission of multiple signals. The purpose of the cavity is to provide a resonant bandpass of a specific frequency, either 30 kHz or 200 kHz. The characteristic of a resonance also provides a significant amount of rejection from the other cavities, usually in the order of 30 to 40 dB. To alter the bandpass characteristics, the Q of the cavity is changed. The cavity Q is defined as the quality factor and is sometimes stated as the ratio of the energy stored to energy lost. The bandwidth of a resonant circuit in terms of Q is: BW=fr/Q, where BW is bandwidth, and fr is frequency. The Q value defines the selectivity of the cavity and these bandpass characteristics.

In FIG. 3, the combiner network 46 is shown in further detail. A tuning processor 60 is coupled to a stepper motor 62 to provide movement to alter the size of the resonant cavity of the bandpass cavity filter 44. The tuning processor is also coupled to other elements in FIG. 3 as needed to provide control. Such connections are known in the art and are not shown herein to avoid obscuring the invention. A tuning housing 63 and tuning actuator 64 operate to provide changes to the length of a telescoping neck to adjust insertion loss. Sensors and a feedback loop 66 provide for fine tuning of the characteristics of the housing. A coupler 68 is used to adjust to changing Q caused by the change in size of the resonant cavity.

In operation, a signal processor 70 is controlled by an operator to reconfigure the number of bandpass cavity filters 44 devoted to each protocol. Each cavity filter 44 has two settings of selected resonant cavity parameters, one for each of the protocols. More settings to accommodate more protocols may also be provided. The signal processor 70 provides control signals through the TDMA or EDGE signals at 108, which are processed by tuning processor 60 to provide appropriate signals to stepper motor 62 and tuning housing mechanism 63 to appropriately change selected bandpass filters to accommodate the desired mix of protocols.

Further detail of the bandpass filters 44 is shown in FIG. 4. Stepper motor 62 is coupled to a tuning plate 104 to provide adjustment thereof under control of the tuning processor 60. The adjustment is shown by double arrow 106 as a lateral motion further into or out of the tuning cavity 102 to modify the cavity size. Size alteration provides a minimal amount of change to the Q of the filter and provides sufficient altering of the bandwidth and frequency. Stepper motor 62 drives the internal plate 104 that modifies the cavity size. In conjunction, the coupling tuner 68 is turned to adjust to the resulting change in Q in the cavity 102. The motion is provided by connecting member 110, which is coupled between the stepper motor 62 and tuning plate 104. Other types of actuators/motors may be used that provide similar longitudinal motion of the plate 104.

Tuning actuator 64 is shown disposed in a telescoping tuning housing 118 to move a tuning actuator 64 laterally within the housing to adjust the length in order to be optimum for frequency specific requirements. This motion is provided by tuning actuator or motor 114 via axel 116. Motor 114 serves a dual purpose in one embodiment by disengaging from the telescoping neck and driving tuning actuator 64 for fine tuning purposes in the frequency band of interest. These movements provide alteration to the internal structure of the filter, which changes the bandwidth and frequency of operation. With the use of stepper motors, remote tuning and stabilization is achieved. With coupling and sensors through feedback loop 66, changes due to temperature and vibration within the cavity are changed to offer maximum propagation of the signal.

In one embodiment, all four bandpass filters 44 in an autotune combiner 46 have been set to transmit signals using the AMPS/TDMA protocol. The output from the antenna 22 will then comprise 100% AMPS/TDMA, which all of the filters 44 will pass, and 0% of EDGE which none of the filters will pass. If one of the filters 44 is set to pass EDGE and the other three filters pass AMPS/TDMA, the signals emitted by the antenna 22 will be 75% AMPS/TDMA and 25% EDGE. If there is enough demand for the use of signals using the EDGE protocol, a second filter may be adjusted to pass EDGE signals, making the ration 50%/50% or 1:1.

The necessary adjustments to the filters 44 are preferably made from a location remote from the base station 10. For example, the system operator may utilize a wire, radio or other link between stepping motors 62 which operate tuning actuator 64 and mechanisms 110 that adjust the end plate 104 within the cavity 102. The link may render operative or inoperative the power source for the stepping motor 62 or may control its function in any other known manner. This may be achieved by personnel at the remote location sending appropriate signals over the link to operate the stepping motor to achieve a selected position of the end plate and, accordingly, of the cavity Q to pass or not pass the two different signals. While the remote sending of the adjusting signals can be effected manually, it may be preferred to automatically achieve the desired adjustment of the filters 44. Specifically, facilities in the system measure the demand for communication channels using the two protocols. This measurement is used to produce an adjustment signal to the actuators for the stepping motors. Measurement of demand may be continuous or periodic.

Other embodiments will be apparent to those of skill in the art. While stepper motors have been described, other motors and combination of motors and power transfer mechanisms may be used to provide the desired modifications of various cavity parameters to obtain desired frequencies. Further, more than two frequencies may easily be provided for. While preferred and other embodiments of the present invention are described above, the scope of the present invention shall be determined from the following claims.

We claim:

1. A bandpass filter for a transmission system that operates with different communication protocols that require different frequencies, the bandpass filter comprising:
   a cavity capable of resonating at a first frequency, when cavity parameters are in a set of first conditions, and at a second frequency, when the cavity parameters are in a set of second conditions;
   a movable facility within the cavity for selectively affecting the condition of the parameters of the cavity pursuant to the respective positions thereof; and
   apparatus for selectively moving the movable facility in response to a tuning command from a remote location.

2. A bandpass filter as in claim 1, wherein:
   the affected parameters are bandpass Q and insertion loss.

3. A bandpass filter as in claim 2, wherein:
   the movable facilities include an electrically conductive plate movable within the cavity to change the length and, therefore, the Q thereof.

4. A bandpass filter as in claim 2, wherein:
   the movable facilities include a non-air dielectric element movable within the cavity to alter the Q thereof.

5. A bandpass filter as in claim 4, wherein:
   the movable facilities include an electrically conductive plate movable within the cavity to change the length and, therefore, the Q thereof.

6. A bandpass filter as in claim 1 wherein:
   the affected parameters are bandpass characteristic and center frequency.

7. A bandpass filter as in claim 1, wherein:
   the broadcast protocols are AMPS/TDMA at 30 kHz and EDGE at 200 kHz.

8. In a cellular telephone system having a base station which includes an antenna and two transmitters each of which is compliant with a respective broadcast protocol, a bandpass filter for connecting the antenna to the transmitters, which comprises:
   a cavity capable of resonating at a first frequency, when the parameters thereof are collectively in selected first conditions, and at a second frequency, when the parameters thereof are collectively in selected second conditions, the first frequency being compatible with one of the broadcast protocols and the second frequency being compatible with the other protocol;
   one or more movable facilities within the cavity for selectively affecting the condition of the parameters of the cavity pursuant to the respective positions thereof; and
   apparatus for selectively moving the movable facilities in response to the receipt of a move command from a location which is remote from the base station to effect the assumption by the cavity parameters of the first selected conditions or the second selected conditions.

9. A bandpass filter as in claim 8, wherein:
   the movable facilities and the selective moving apparatus comprise
   individual elements, movement of each of which affects a parameter of the cavity; and
   a prime mover associated with each element for movement thereof in response to energization thereof.

10. A bandpass filter as in claim 9, wherein:
    each prime mover comprises a selectively energizable electric motor connected to its element and mounted with respect to the cavity so that energization of the motor translates the element.

11. A bandpass filter as in claim 10, wherein:
    one or more prime movers may be selectively, individually connected to plural elements by the move command.

12. In a cellular telephone base station having plural transmitters, a group of N bandpass filters phased together and employable to interconnect an antenna to the outputs of the transmitters, each of which transmitters is compliant with one or the other of two respective broadcast protocols, each filter comprising:
    a cavity capable of resonating at a first frequency, when the parameters thereof collectively assume selected first conditions, and at a second frequency, when the parameters thereof collectively assume selected second conditions, the first frequency being compatible with one of the broadcast protocols and the second frequency being compatible with the other protocol;
    one or more movable facilities within the cavity for selectively affecting the condition of the parameters of the cavity pursuant to the respective positions thereof; and
    apparatus for selectively moving the movable facilities in response to the receipt of a move command from a location, which is remote from the base station, to effect the assumption by the cavity parameters of the first selected conditions or the second selected conditions, so that a number, X, of the cavities resonate at the first frequency and N−X of the cavities resonate at the second frequency, X being from zero through N, and the antenna's transmission is made up of X/N of the first frequency and (N−X)/N of the second frequency, the antenna accordingly being capable of transmitting from 0% to 100% of each frequency in increments of 1/N %.

13. A group of bandpass filters as in claim 12, wherein:
    N=4, and X varies from 0 to 4.

14. A dual mode combiner employable to interconnect an antenna to two transmitters each compliant with a respective broadcast protocol, which comprises:
    a cavity capable of resonating simultaneously at a first frequency and a second frequency, the first frequency being compatible with one of the broadcast protocols and the second frequency being compatible with the other protocol;
    one or more first movable facilities within the cavity for selectively affecting the condition of the parameters of the cavity pursuant to the respective positions thereof so that if the capacity of the cavity for one of the frequencies is X %, the capacity of the cavity for the other frequency is 100−X %;
    one or more second movable facilities within the cavity for selectively affecting the condition of the parameters of the cavity pursuant to the respective positions thereof so that the center frequency of the cavity's bandpass characteristics may be adjusted; and apparatus for selectively moving the movable facilities in response to the receipt of a move command from a location, which is remote from the cavity, to effect the assumption by the cavity parameters of the first selected conditions or the second selected conditions.

15. A method of accommodating multiple communication protocols in a base station, the method comprising:

tuning multiple bandpass cavity filters to one or more desired frequencies;

sending a tuning command from a remote location to a selected bandpass cavity filter requesting a change in physical characteristics of the bandpass cavity filters; and retuning the selected bandpass filter based on the signal to change its bandpass frequency response.

16. A cellular base station comprising:

a plurality of transceivers;

a plurality of corresponding power amplifiers coupled to the transceivers;

an antenna;

an autotune combiner network having multiple bandpass cavity filters, wherein at least one bandpass cavity filter further comprises:

a receiver that receives tuning commands from a remote location;

a tuning plate responsive to the receiver, and a telescoping tuning housing responsive to the receiver.

17. The cellular base station of claim 16 and further comprising a stepper motor coupled to the tuning plate for moving the tuning plate responsive to the receiver to change Q of the bandpass cavity filter.

18. The cellular base station of claim 17 and further comprising a coupling tuner coupled to the cavity of the bandpass cavity filter for adjusting the Q of the bandpass cavity filter.

19. The cellular base station of claim 16 and further comprising a tuning motor coupled to a tuning actuator for changing the length of a neck in the cavity filter.

20. The cellular base station of claim 19 and further comprising a feedback loop for fine tuning the bandpass characteristics of the bandpass cavity filter.

* * * * *

UNITED STATES PATENT AND TRADEMARK OFFICE
CERTIFICATE OF CORRECTION

PATENT NO.     : 6,898,419 B1
DATED          : May 24, 2005
INVENTOR(S)    : Fayeski et al.

It is certified that error appears in the above-identified patent and that said Letters Patent is hereby corrected as shown below:

<u>Title page,</u>
Item [56], References Cited, U.S. PATENT DOCUMENTS, delete "333/206" and insert -- 333/208 --, therefor.

<u>Column 8,</u>
Line 6, delete "receiver," and insert -- receiver; --, therefor.

Signed and Sealed this

Twelfth Day of July, 2005

JON W. DUDAS
*Director of the United States Patent and Trademark Office*